US011802928B2

(12) United States Patent
Lee (10) Patent No.: US 11,802,928 B2
(45) Date of Patent: Oct. 31, 2023

(54) MAGNETIC RESONANCE IMAGING APPARATUS FOR MEASURING MAGNETIC RESONANCE IMAGING PARAMETERS AND METHOD OF OPERATING THE SAME

(71) Applicant: KYUNGPOOK NATIONAL UNIVERSITY INDUSTRY-ACADEMIC COOPERATION FOUNDATION, Daegu (KR)

(72) Inventor: Hyunyeol Lee, Daegu (KR)

(73) Assignee: KYUNGPOOK NATIONAL UNIVERSITY INDUSTRY-ACADEMIC COOPERATION FOUNDATION, Daegu (KR)

( * ) Notice: Subject to any disclaimer, the term of this patent is extended or adjusted under 35 U.S.C. 154(b) by 0 days.

(21) Appl. No.: 17/834,512

(22) Filed: Jun. 7, 2022

(65) Prior Publication Data
US 2022/0397628 A1 Dec. 15, 2022

(30) Foreign Application Priority Data
Jun. 10, 2021 (KR) ........................ 10-2021-0075298

(51) Int. Cl.
*G01R 33/565* (2006.01)
*G01R 33/48* (2006.01)
(Continued)

(52) U.S. Cl.
CPC ... *G01R 33/56554* (2013.01); *G01R 33/4806* (2013.01); *G01R 33/50* (2013.01); *G01R 33/5608* (2013.01)

(58) Field of Classification Search
CPC ................ G01R 33/4806; G01R 33/50; G01R 33/5608; G01R 33/56554
See application file for complete search history.

(56) References Cited

U.S. PATENT DOCUMENTS

| 9,052,372 B2* | 6/2015 | Palma ..................... G01R 33/50 |
| 2006/0139027 A1* | 6/2006 | Dreher ................. G01R 33/485 |
| | | 324/309 |

FOREIGN PATENT DOCUMENTS

| KR | 10-1418170 B1 | 7/2014 |
| KR | 10-2015-0135249 A | 12/2015 |
| KR | 10-1699528 B1 | 1/2017 |

OTHER PUBLICATIONS

Lee, H, Wehrli, FW. Alternating unbalanced SSFP for 3D mapping of the human brain. Magn Reson Med. 2021; 85: 2391-2402. https://doi.org/10.1002/mrm.28637 (Year: 2021).*

(Continued)

*Primary Examiner* — Gregory H Curran
(74) *Attorney, Agent, or Firm* — Sughrue Mion, PLLC (57) ABSTRACT

The present disclosure relates to magnetic resonance imaging technology for simultaneously measuring a plurality of magnetic resonance imaging parameters. According to one embodiment of the present disclosure, a magnetic resonance imaging apparatus includes a data collector for alternately collecting a steady-state-free-precession (SSFP)-FID signal and an SSFP-ECHO signal within a time of repetition to obtain AUSFIDE (alternating unbalanced SSFP-FID & SSFP-ECHO) image data; a data processor for reconstructing a magnitude image and a phase image for each of the SSFP-FID signal and the SSFP-ECHO signal in the AUS-FIDE (alternating unbalanced SSFP-FID & SSFP-ECHO) image data and processing the AUSFIDE (alternating unbalanced SSFP-FID & SSFP-ECHO) image data using the reconstructed magnitude images and phase images; and a parameter measuring device for measuring a plurality of magnetic resonance imaging parameters using a plurality of echo data based on the processed AUSFIDE (alternating unbalanced SSFP-FID & SSFP-ECHO) image data.

12 Claims, 9 Drawing Sheets

(51) Int. Cl.
  *G01R 33/50*  (2006.01)
  *G01R 33/56*  (2006.01)

(56) References Cited

OTHER PUBLICATIONS

Notice of Allowance dated Dec. 1, 2022 in Korean Application No. 10-2021-0075298.
Lee et al., "Whole-brain 3D mapping of oxygen metabolism using constrained quantitative BOLD", NeuroImage, 2022, vol. 250, pp. 1-12 (12 total pages).

* cited by examiner

MAGNETIC RESONANCE IMAGING APPARATUS FOR MEASURING MAGNETIC RESONANCE IMAGING PARAMETERS AND METHOD OF OPERATING THE SAME

CROSS-REFERENCE TO RELATED APPLICATION

This application claims priority to Korean Patent Application No. 10-2021-0075298, filed on Jun. 10, 2021, in the Korean Intellectual Property Office, the disclosure of which is incorporated herein by reference

BACKGROUND OF THE DISCLOSURE

Field of the Disclosure

The present disclosure relates to magnetic resonance imaging technology for simultaneously measuring a plurality of magnetic resonance imaging parameters, and more particularly, to technology for collecting AUSFIDE (alternating unbalanced SSFP-FID & SSFP-ECHO) image data by alternately collecting an SSFP-FID signal and an SSFP-ECHO signal and combining the SSFP-FID signal at the front end and the SSFP-ECHO signal at the rear end and measuring a plurality of magnetic resonance imaging parameters using the collected AUSFIDE image data.

Description of the Related Art

Magnetic susceptibility ($\chi$) is a main factor that determines the contrast of a magnetic resonance image.

In addition, an RF-irreversible transverse relaxation rate constant (R2) and an RF-reversible transverse relaxation rate constant (R2') are parameters that reflect the characteristics of a body inside a magnetic resonance imaging apparatus.

The RF-reversible transverse relaxation rate constant (R2') is controlled by diffusion of water molecules in a non-uniform field on a microscopic scale.

The RF-reversible transverse relaxation rate constant (R2') is generated due to an induced magnetic field varying between molecular and image voxel sizes. Since the induced field changes slightly from a time when an excitation pulse is applied to a time when a spin echo is acquired, the resulting signal loss is RF-reversible.

Mapping of the RF-reversible transverse relaxation rate constant (R2') may provide an opportunity to evaluate the microstructure of tissues.

According to a conventional brain study, the RF-reversible transverse relaxation rate constant (R2') may exhibit a high correlation with an increase in iron concentration in Parkinson's disease.

In addition, when quantifying the RF-reversible transverse relaxation rate constant (R2'), the degree of oxygenation of a tumor may be effectively evaluated.

In particular, the RF-reversible transverse relaxation rate constant (R2') may be different for each brain region. In addition, according to the existing research results, the RF-reversible transverse relaxation rate constant (R2') is slightly different depending on the type of disease.

Accordingly, when an RF-reversible transverse relaxation rate constant (R2') is measured more accurately for each pixel, since the RF-reversible transverse relaxation rate constant (R2') is different between normal and diseased tissues in a specific disease, the RF-reversible transverse relaxation rate constant (R2') may be used as a biomarker.

In the case of conventional magnetic resonance imaging technology for quantitatively measuring a plurality of magnetic resonance imaging parameters such as R2, R2', and magnetic susceptibility represented by GESFIDE and GESSE, only a few two-dimensional slices may be measured, and imaging the entire brain takes very long time, so the technology is not practical at all.

Common problems with the existing technology for measuring R2* or R2' also includes sensitivity to macroscopic magnetic field non-uniformities and the resulting resonant frequency shift ($\Delta\omega 0$).

Since a large-scale induced magnetic field usually causes significant distortion in a signal sampled at longer TE, large errors appear particularly in the vicinity of the air and tissue interface regions during parameter quantification.

SUMMARY OF THE DISCLOSURE

Therefore, the present disclosure has been made in view of the above problems, and it is an object of the present disclosure to obtain AUSFIDE (alternating unbalanced SSFP-FID & SSFP-ECHO) image data by alternately collecting an SSFP-FID signal and an SSFP-ECHO signal and combining the SSFP-FID signal at the front end and the SSFP-ECHO signal at the rear end and measure a plurality of magnetic resonance imaging parameters using the collected AUSFIDE image data.

It is another object of the present disclosure to generate magnetic resonance imaging data for simultaneously measuring a plurality of magnetic resonance imaging parameters including an RF-irreversible transverse relaxation rate constant (R2), an RF-reversible transverse relaxation rate constant (R2'), and magnetic susceptibility.

It is still another object of the present disclosure to provide an SSFP integration sequence by alternately collecting an SSFP-FID signal and an SSFP-ECHO signal and combining the SSFP-FID signal at the front end and the SSFP-ECHO signal at the rear end.

It is still another object of the present disclosure to increase a measurement speed for a plurality of magnetic resonance imaging parameters using AUSFIDE image data.

It is still another object of the present disclosure to measure a plurality of magnetic resonance imaging parameters including an RF-irreversible transverse relaxation rate constant (R2), an RF-reversible transverse relaxation rate constant (R2'), and magnetic susceptibility that may be used as biomarkers indicating the difference between a normal tissue and a diseased tissue for a specific disease.

It is yet another object of the present disclosure to improves parameter measurement accuracy by inserting image data for z-shimming in the even-numbered echo data when obtaining AUSFIDE image data and removing signal distortion that appears according to non-uniformity of a magnetic field in an odd-numbered image signal using the inserted image data.

In accordance with one aspect of the present disclosure, provided is a magnetic resonance imaging apparatus including a data collector for alternately collecting a steady-state-free-precession (SSFP)-FID signal and an SSFP-ECHO signal within a time of repetition to obtain AUSFIDE (alternating unbalanced SSFP-FID & SSFP-ECHO) image data; a data processor for reconstructing a magnitude image and a phase image for each of the SSFP-FID signal and the SSFP-ECHO signal in the AUSFIDE (alternating unbalanced SSFP-FID & SSFP-ECHO) image data and processing the AUSFIDE (alternating unbalanced SSFP-FID & SSFP-ECHO) image data using the reconstructed magnitude images and phase images; and a parameter measuring device for measuring a plurality of magnetic resonance imaging parameters using a plurality of echo data based on the processed AUSFIDE (alternating unbalanced SSFP-FID & SSFP-ECHO) image data.

The data collector may generate a plurality of gradient echo signals for each of the steady-state-free-precession (SSFP)-FID signal and the SSFP-ECHO signal within the time of repetition and may obtain the AUSFIDE (alternating unbalanced SSFP-FID & SSFP-ECHO) image data composed of the gradient echo signals.

The data collector may determine a first relaxation rate constant (R*) associated with the steady-state-free-precession (SSFP)-FID signal as a sum of an RF-irreversible transverse relaxation rate constant (R2) and an RF-reversible transverse relaxation rate constant (R2').

The data collector may determine a second relaxation rate constant (R**) associated with the SSFP-ECHO signal as a difference between an RF-irreversible transverse relaxation rate constant (R2) and an RF-reversible transverse relaxation rate constant (R2').

The magnetic resonance imaging parameters may include at least one of an RF-irreversible transverse relaxation rate constant (R2), an RF-reversible transverse relaxation rate constant (R2'), and magnetic susceptibility.

The data processor may reconstruct a magnitude image and a phase image for each of the SSFP-FID signal and the SSFP-ECHO signal, may obtain an induced magnetic field gradient map in a Z-direction using the reconstructed phase image, and may estimate a voxel spreading function along the Z-direction using the induced magnetic field gradient map in the Z-direction.

The data processor may insert even-numbered echo data among echo data associated with the reconstructed magnitude images and phase images as correction data for non-uniformity of a magnetic field.

The data processor may correct non-uniformity of the magnetic field by correcting odd-numbered echo data among echo data associated with the reconstructed magnitude images and phase images using the even-numbered echo data.

In accordance with another aspect of the present disclosure, provided is a method of operating a magnetic resonance imaging apparatus, the method including, in a data collector, obtaining AUSFIDE (alternating unbalanced SSFP-FID & SSFP-ECHO) image data by alternately collecting a steady-state-free-precession (SSFP)-FID signal and an SSFP-ECHO signal within a time of repetition; in a data processor, reconstructing a magnitude image and a phase image for each of the SSFP-FID signal and the SSFP-ECHO signal in the AUSFIDE (alternating unbalanced SSFP-FID & SSFP-ECHO) image data and processing the AUSFIDE (alternating unbalanced SSFP-FID & SSFP-ECHO) image data using the reconstructed magnitude images and phase images; and in a parameter measuring device, measuring a plurality of magnetic resonance imaging parameters using a plurality of echo data based on the processed AUSFIDE (alternating unbalanced SSFP-FID & SSFP-ECHO) image data.

The obtaining may include generating a plurality of gradient echo signals for each of the steady-state-free-precession (SSFP)-FID signal and the SSFP-ECHO signal within the time of repetition and obtaining the AUSFIDE (alternating unbalanced SSFP-FID & SSFP-ECHO) image data composed of the gradient echo signals.

The obtaining may include determining a first relaxation rate constant (R*) associated with the steady-state-free-precession (SSFP)-FID signal as a sum of an RF irreversible transverse relaxation rate constant (R2) and an RF-reversible transverse relaxation rate constant (R2'); and determining a second relaxation rate constant (R**) associated with the SSFP-ECHO signal as a difference between an RF irreversible transverse relaxation rate constant (R2) and an RF-reversible transverse relaxation rate constant (R2').

The magnetic resonance imaging parameters may include at least one of an RF-irreversible transverse relaxation rate constant (R2), an RF-reversible transverse relaxation rate constant (R2'), and magnetic susceptibility.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Specific structural and functional descriptions of embodiments according to the concept of the present disclosure disclosed herein are merely illustrative for the purpose of explaining the embodiments according to the concept of the present disclosure. Furthermore, the embodiments according to the concept of the present disclosure can be implemented in various forms and the present disclosure is not limited to the embodiments described herein.

The embodiments according to the concept of the present disclosure may be implemented in various forms as various modifications may be made. The embodiments will be described in detail herein with reference to the drawings. However, it should be understood that the present disclosure is not limited to the embodiments according to the concept of the present disclosure, but includes changes, equivalents, or alternatives falling within the spirit and scope of the present disclosure.

The terms such as "first" and "second" are used herein merely to describe a variety of constituent elements, but the constituent elements are not limited by the terms. The terms are used only for the purpose of distinguishing one constituent element from another constituent element. For example, a first element may be termed a second element and a second element may be termed a first element without departing from the teachings of the present disclosure.

It should be understood that when an element is referred to as being "connected to" or "coupled to" another element, the element may be directly connected or coupled to the other element or intervening elements may be present. In contrast, when an element is referred to as being "directly connected to" or "directly coupled to" another element, there are no intervening elements present. Other words used to describe the relationship between elements or layers should be interpreted in a like fashion (e.g., "between," versus "directly between," "adjacent," versus "directly adjacent," etc.).

The terms used in the present specification are used to explain a specific exemplary embodiment and not to limit the present inventive concept. Thus, the expression of singularity in the present specification includes the expression of plurality unless clearly specified otherwise in context. Also, terms such as "include" or "comprise" should be construed as denoting that a certain characteristic, number, step, operation, constituent element, component or a combination thereof exists and not as excluding the existence of or a possibility of an addition of one or more other characteristics, numbers, steps, operations, constituent elements, components or combinations thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, preferred embodiments of the present disclosure will be described in detail with reference to the accompanying drawings. However, the scope of the present disclosure is not limited by these embodiments. Like reference numerals in the drawings denote like elements.

Figure 1:
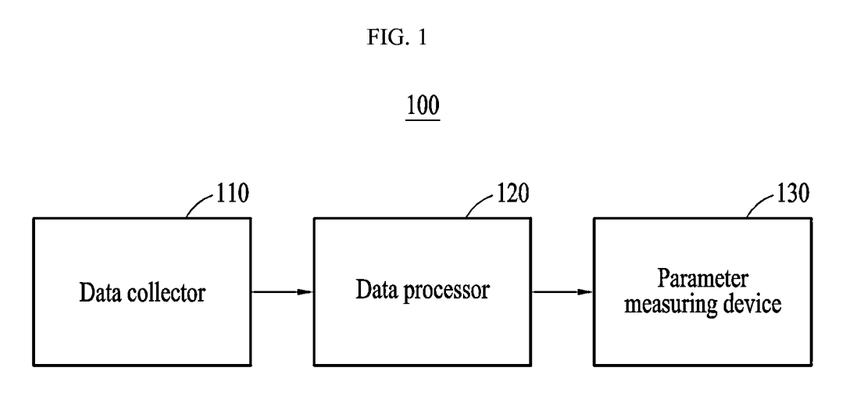
FIG. 1 is a diagram for explaining a magnetic resonance imaging apparatus for measuring a plurality of magnetic resonance imaging parameters according to one embodiment of the present disclosure.

FIG. 1 is a diagram for explaining a magnetic resonance imaging apparatus for measuring a plurality of magnetic resonance imaging parameters according to one embodiment of the present disclosure.

FIG. 1 illustrates the components of the magnetic resonance imaging apparatus according to one embodiment of the present disclosure.

Referring to FIG. 1, a magnetic resonance imaging apparatus 100 according to one embodiment of the present disclosure is a magnetic resonance imaging apparatus for measuring a plurality of magnetic resonance imaging parameters and includes a data collector 110, a data processor 120, and a parameter measuring device 130.

According to one embodiment of the present disclosure, the data collector 110 may obtain AUSFIDE (alternating unbalanced SSFP-FID & SSFP-ECHO) image data by alternately collecting a steady-state-free-precession (SSFP)-FID signal and an SSFP-ECHO signal within a time of repetition (TR). In this case, the SSFP-FID signal and the SSFP-ECHO signal have opposite polarities.

For example, the data collector 110 may generate a plurality of gradient echo signals for each of an SSFP-FID signal and an SSFP-ECHO signal within a time of repetition and may obtain AUSFIDE (alternating unbalanced SSFP-FID & SSFP-ECHO) image data composed of the gradient echo signals.

According to one embodiment of the present disclosure, the data collector 110 may determine a first relaxation rate constant (R*) associated with an SSFP-FID signal as a sum of an RF-irreversible transverse relaxation rate constant (R2) and an RF-reversible transverse relaxation rate constant (R2').

For example, the data collector 110 may determine a second relaxation rate constant (R**) associated with an SSFP-ECHO signal as a difference between an RF-irreversible transverse relaxation rate constant (R2) and an RF-reversible transverse relaxation rate constant (R2').

Accordingly, according to the present disclosure, AUSFIDE (alternating unbalanced SSFP-FID & SSFP-ECHO) image data may be collected by alternately collecting an SSFP-FID signal and an SSFP-ECHO signal and combining the SSFP-FID signal at the front end and the SSFP-ECHO signal at the rear end, and a plurality of magnetic resonance imaging parameters may be measured using the collected AUSFIDE image data.

According to one embodiment of the present disclosure, the data processor 120 may reconstruct a magnitude image and a phase image for each of an SSFP-FID signal and an SSFP-ECHO signal in AUSFIDE (alternating unbalanced SSFP-FID & SSFP-ECHO) image data and may process AUSFIDE (alternating unbalanced SSFP-FID & SSFP-ECHO) image data using the reconstructed magnitude image and phase image.

For example, the data processor 120 may reconstruct a magnitude image and a phase image for each of an SSFP-FID signal and an SSFP-ECHO signal.

In addition, the data processor 120 may obtain an induced magnetic field gradient map in the Z-direction using a reconstructed phase image and may estimate a voxel spreading function along the Z-direction using the induced magnetic field gradient map in the Z-direction.

For example, the data processor 120 may perform data correction using an estimated voxel spreading function.

According to one embodiment of the present disclosure, the data processor 120 may insert even-numbered echo data among echo data associated with a reconstructed magnitude image and phase image as correction data for non-uniformity of a magnetic field.

For example, the data processor 120 may correct non-uniformity of a magnetic field by correcting odd-numbered echo data among echo data associated with a reconstructed magnitude image and phase image using even-numbered echo data.

Accordingly, according to the present disclosure, when reconstructing AUSFIDE image data, by inserting image data in an even-numbered data and removing the effect of non-uniformity of a magnetic field in the odd-numbered data using the inserted image data, measurement accuracy for magnetic resonance imaging parameters may be improved.

According to one embodiment of the present disclosure, the parameter measuring device 130 may measure a plurality of magnetic resonance imaging parameters using a plurality of echo data based on AUSFIDE (alternating unbalanced SSFP-FID & SSFP-ECHO) image data.

For example, a plurality of magnetic resonance imaging parameters may include at least one of an RF-irreversible transverse relaxation rate constant (R2), an RF-reversible transverse relaxation rate constant (R2'), and magnetic susceptibility.

According to one embodiment of the present disclosure, the parameter measuring device 130 may generate a parameter map using a plurality of echo data based on AUSFIDE (alternating unbalanced SSFP-FID & SSFP-ECHO) image data processed by the data processor 120, and the generated parameter map may be associated with a plurality of magnetic resonance imaging parameters.

For example, the parameter map may include image data that directly displays quantitative values for magnetic resonance imaging parameters.

For example, the parameter measuring device 130 may generate a parameter map using a first relaxation rate constant (R*) and a second relaxation rate constant (R**) calculated from the echo data signals of SSFP-FID and the echo data signals of SSFP-ECHO.

Accordingly, since the magnetic resonance imaging apparatus 100 according to one embodiment of the present disclosure simultaneously uses a first relaxation rate constant (R*) and a second relaxation rate constant (R**), errors in parameter measurement are reduced.

In addition, according to the present disclosure, magnetic resonance imaging for simultaneously measuring a plurality of magnetic resonance imaging parameters including an RF-irreversible transverse relaxation rate constant (R2), an RF-reversible transverse relaxation rate constant (R2'), and magnetic susceptibility may be generated.

In addition, according to the present disclosure, by alternately collecting an SSFP-FID signal and an SSFP-ECHO signal and combining the SSFP-FID signal at the front end and the SSFP-ECHO signal at the rear end, an integrated SSFP sequence may be obtained.

Figure 2:
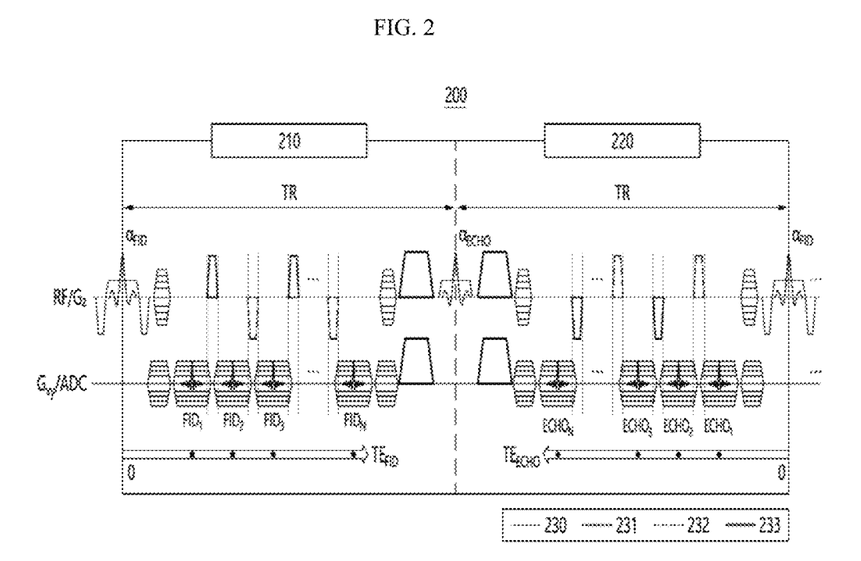
FIG. 2 shows the pulse sequence timing diagram of AUSFIDE (alternating unbalanced SSFP-FID & SSFP-ECHO) image data collected by a magnetic resonance imaging apparatus according to one embodiment of the present disclosure.

FIG. 2 shows the pulse sequence timing diagram of AUSFIDE (alternating unbalanced SSFP-FID & SSFP-ECHO) image data collected by a magnetic resonance imaging apparatus according to one embodiment of the present disclosure.

Referring to FIG. 2, a pulse sequence timing diagram 200 of AUSFIDE image data according to one embodiment of the present disclosure shows a timing diagram of a multi-echo 3D AUSFIDE pulse sequence with z-shimming.

For example, the pulse sequence timing diagram 200 of AUSFIDE image data is divided into an SSFP-FID signal acquisition group 210 and an SSFP-ECHO signal acquisition group 220 and shows sampling of a plurality of SSFP-FID signals and a plurality of SSFP-ECHO signals.

A plurality of SSFP-FID signals may be composed of $FID_1$ to $FID_N$, and a plurality of SSFP-ECHO signals may be composed of $ECHO_1$ to $ECHO_N$.

The SSFP-FID signal acquisition group 210 and the SSFP-ECHO signal acquisition group 220 have different phases.

The phases of SSFP-FID signal and SSFP-ECHO signal are symmetrical with respect to a dotted line in the center.

The SSFP-FID signal acquisition group 210 and the SSFP-ECHO signal acquisition group 220 may be associated with the data collector described in FIG. 1.

According to one embodiment of the present disclosure, a plurality of SSFP-FID signals and a plurality of SSFP-ECHO signals are collected at the same time of repetition (TR).

The SSFP-FID signal acquisition group 210 and the SSFP-ECHO signal acquisition group 220 may alternate in a successive TR period and the SSFP-FID signal acquisition group 210 and the SSFP-ECHO signal acquisition group 220 may have a mutually integrated configuration in which the SSFP-FID signal acquisition group 210 is located at the front end and the SSFP-ECHO signal acquisition group 220 is located at the rear end.

The SSFP-FID signal acquisition group 210 and the SSFP-ECHO signal acquisition group 220 may use equidistant RF pulses having a coherent phase so that the sum of the areas of gradient pulses within each time of repetition in all three directions may be constant.

For example, the data collector may selectively obtain SSFP-FID and SSFP-ECHO signals within a corresponding module by symmetrically positioning left and right imaging gradient pulses with respect to a central RF pulse (flip angle: αECHO).

That is, the gradient pulse structures of the two SSFP blocks are time-symmetric. On the other hand, since a spoiler generates a sufficiently large intra voxel de-pacing ($\geq 4\pi$), SSFP signals may be selectively obtained according to the 0th and 1st spin paths, respectively.

For example, in the pulse sequence timing diagram 200 of AUSFIDE image data, a first leader line 230 may indicate spatial encoding and rewinding signals, a second leader line 231 may indicate a z-shimming signal, a third leader line 232 may indicate a z-shim rewinder signal, and a fourth leader line 233 may be a spoiler.

The present disclosure may relate to technology in which signals sensitive to an RF-irreversible transverse relaxation rate constant (R2) and an RF-reversible transverse relaxation rate constant (R2') are obtained in a three-dimensional whole volume at high speed, the RF-irreversible transverse relaxation rate constant (R2) and the RF-reversible transverse relaxation rate constant (R2') are obtained using the obtained signals, and an integrated sequence of SSFP is obtained by combining an SSFP-FID signal at the front end and an SSFP-ECHO signal at the rear end.

Figure 3:
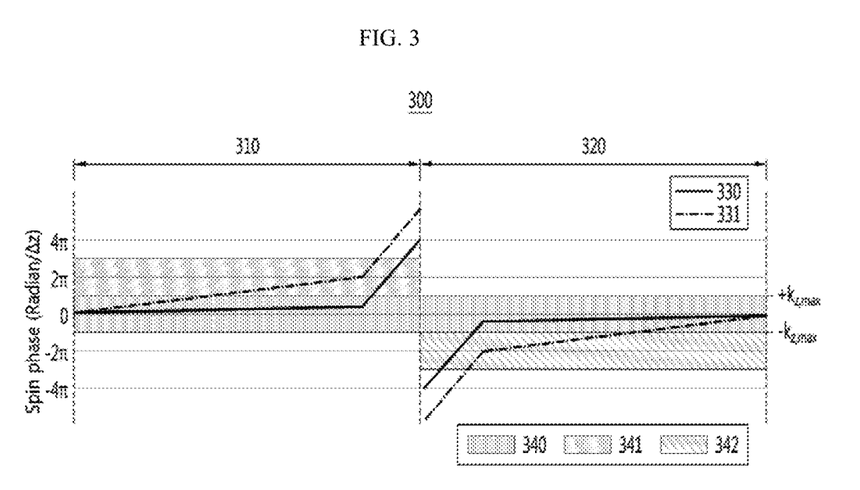
FIG. 3 shows an extended phase graph for the pulse sequence of AUSFIDE (alternating unbalanced SSFP-FID & SSFP-ECHO) image data collected by a magnetic resonance imaging apparatus according to one embodiment of the present disclosure.

FIG. 3 is an extended phase graph for the pulse sequence of AUSFIDE (alternating unbalanced SSFP-FID & SSFP-ECHO) image data collected by a magnetic resonance imaging apparatus according to one embodiment of the present disclosure.

FIG. 3 is a graph showing the temporal evolution of intra voxel spin phases in small and large induced magnetic fields in the Z-direction, respectively.

Referring to a graph 300 of FIG. 3, intra voxel spin phases according to an induced magnetic field in the z direction are represented by a solid line 330 and a dotted line 331, and a conventional encoding region 340, an encoding region 341 of an SSFP-FID signal, and an encoding region 342 of an SSFP-ECHO signal are shown.

The encoding region 341 of an SSFP-FID signal and the encoding region 342 of an SSFP-ECHO signal represent the results of using z-shimming.

When an induced magnetic field in the Z-direction is large, a phase accumulates rapidly over time. After a specific point in time, a spin phase exceeds the conventional encoding region 340.

Referring to the encoding region 341 of an SSFP-FID signal and the encoding region 342 of an SSFP-ECHO signal, proper movement of a kz encoding window using z-shimming may effectively capture a spin affected by non-uniformity of a magnetic field.

There is a need to consider the polarity of z-shimming gradient/rewinder between the SSFP-FID and SSFP-ECHO configurations and the corresponding shifted kz encoding band.

It can be seen that occurrence of a steep spin phase on both sides of a central RF pulse indicates the effect of a spoiler slope.

In addition, the SSFP-ECHO signal may be a signal obtained by obtaining a phase inversion portion of the SSFP-FID signal.

Figure 4:
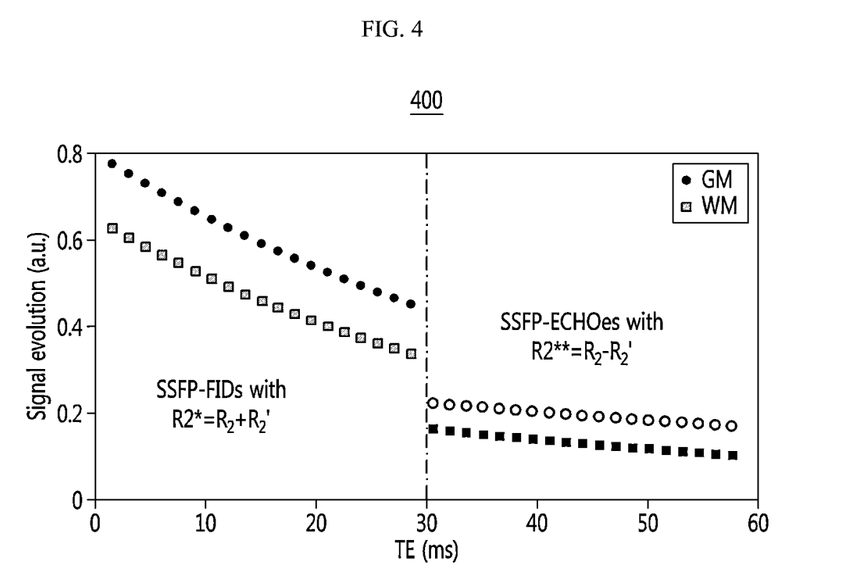
FIG. 4 is a graph showing the measurement results of an SSFP-FID signal and an SSFP-ECHO signal in a magnetic resonance imaging apparatus according to one embodiment of the present disclosure.

FIG. 4 is a graph showing the measurement results of an SSFP-FID signal and an SSFP-ECHO signal in a magnetic resonance imaging apparatus according to one embodiment of the present disclosure.

FIG. 4 illustrates derivation of first and second relaxation rate constants by using the measurement results of an SSFP-FID signal and an SSFP-ECHO signal in the magnetic resonance imaging apparatus according to one embodiment of the present disclosure.

A graph 400 of FIG. 4 shows an example in which SSFP-FID signals are collected according to a change in time of echo (TE), and SSFP-ECHO signals are alternately collected.

A first relaxation rate constant (R*), which is the relaxation rate constant of an SSFP-FID signal, may be determined as a sum of an RF-irreversible transverse relaxation rate constant (R2) and an RF-reversible transverse relaxation rate constant (R2').

A second relaxation rate constant (R**) associated with an SSFP-ECHO signal may be determined as a difference between an RF-irreversible transverse relaxation rate constant (R2) and an RF-reversible transverse relaxation rate constant (R2').

GM may represent a gray matter region, and WM may represent a white matter region.

For example, an RF-reversible transverse relaxation rate constant (R2') may characterize voxel signal modulation according to an induced magnetic field in the presence of deoxygenated hemoglobin or iron deposits of a deep gray matter structure in brain microvasculature.

Figure 5:
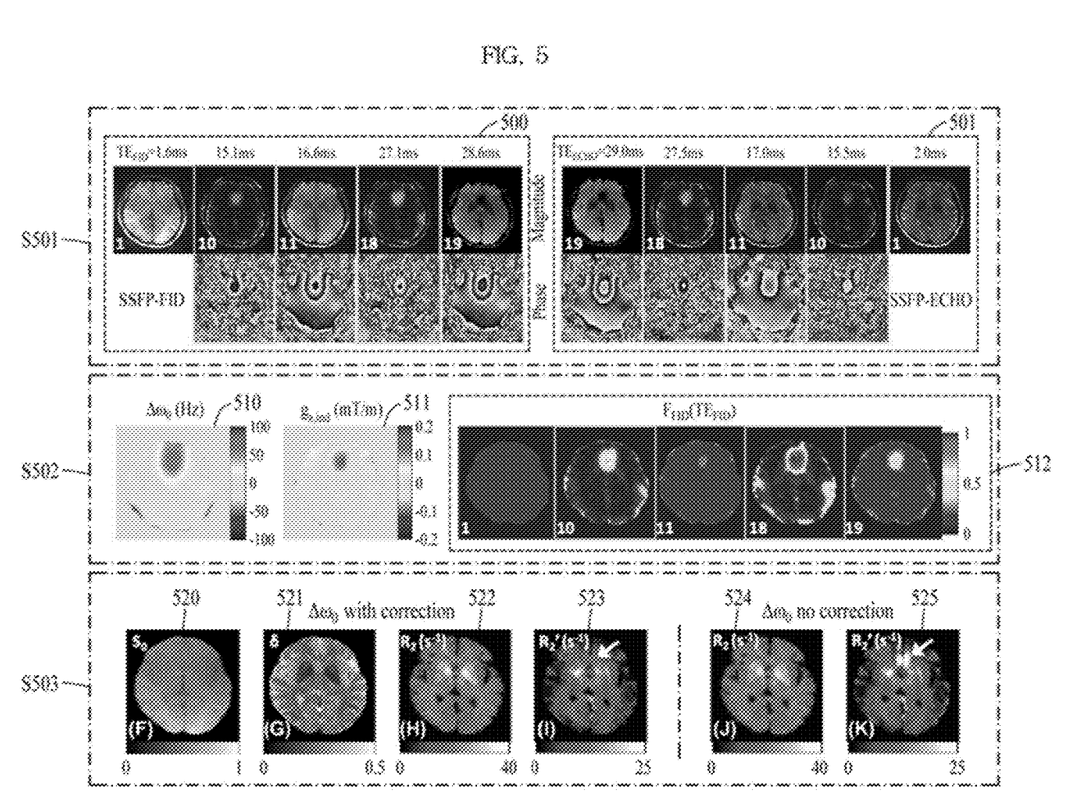
FIG. 5 includes images for explaining data processing and parameter measurement procedures in a magnetic resonance imaging apparatus according to one embodiment of the present disclosure.

FIG. 5 includes images for explaining data processing and parameter measurement procedures in a magnetic resonance imaging apparatus according to one embodiment of the present disclosure.

Referring to FIG. 5, data processing and parameter measurement procedures in a magnetic resonance imaging apparatus include step S501 of reconstructing images, step S502 of estimating and correcting a voxel signal induced by delta omega 0, and step S503 of creating a parameter map through model fitting.

In step S501 of reconstructing images, magnitude and phase images are reconstructed using a plurality of echo data of SSFP-FID and SSFP-ECHO sampled during data sampling time.

The magnitude and phase images may be divided into magnitude and phase images 500 associated with SSFP-FID and magnitude and phase images 601 associated with SSFP-ECHO.

Here, in step S501 of reconstructing images, the red region in delta omega 0 ($\Delta\omega 0$) means that non-uniformity of a magnetic field is increased, and accordingly, a signal appears uniquely in the corresponding region of number 18. Accordingly, image data corresponding to even numbers is to apply technology for correcting signal distortion according to non-uniformity of a magnetic field, and images corresponding to odd numbers may be images used for time series analysis.

A signal may appear to be missing in a region in which delta omega ($\Delta\omega 0$) has a large value in 19th image data among image data.

This may be an image loss due to non-uniformity of a magnetic field. To compensate for this, z-shimming is applied to even-numbered echo data.

In step S502 of estimating and correcting a voxel signal induced by delta omega 0, delta omega 0 ($\Delta\omega 0$) may be first obtained, and its spatial gradient may be obtained by taking spatial differentiation of the delta omega 0 ($\Delta\omega 0$), and based on this information, odd-numbered image data may be corrected.

That is, even-numbered image data may correspond to echo data to which z-shimming is applied.

In step S502 of estimating and correcting a voxel signal induced by delta omega 0, using an image 510 corresponding to delta omega 0 ($\Delta\omega 0$) obtained from the image in step S501 and an image 511 corresponding to a magnetic field gradient (gz, ind) in the Z-direction, images 512 associated with FFID over time may be derived using a voxel spread function (VSF) method.

In step S503 of creating a parameter map through model fitting, both a parameter map image in which delta omega 0 ($\Delta\omega 0$) correction is performed and a parameter map image in which delta omega 0 ($\Delta\omega 0$) correction is not performed may be checked.

Comparing an image 523 and an image 525 associated with an RF-reversible transverse relaxation rate constant (R2'), it can be seen from the arrow part that the accuracy of a parameter map image in which delta omega 0 ($\Delta\omega 0$) has been corrected is relatively higher.

Based on a parameter map image 522 and an image 524 associated with an RF-irreversible transverse relaxation rate constant (R2), an RF-irreversible transverse relaxation rate constant (R2) parameter may be measured.

In addition, since a parameter map image 520 associated with an additional parameter (S0) and a parameter map image 521 associated with another additional parameter ($\delta$) are also obtainable, the additional parameter (S0) and the additional parameter ($\delta$) may be measured.

Figure 6:
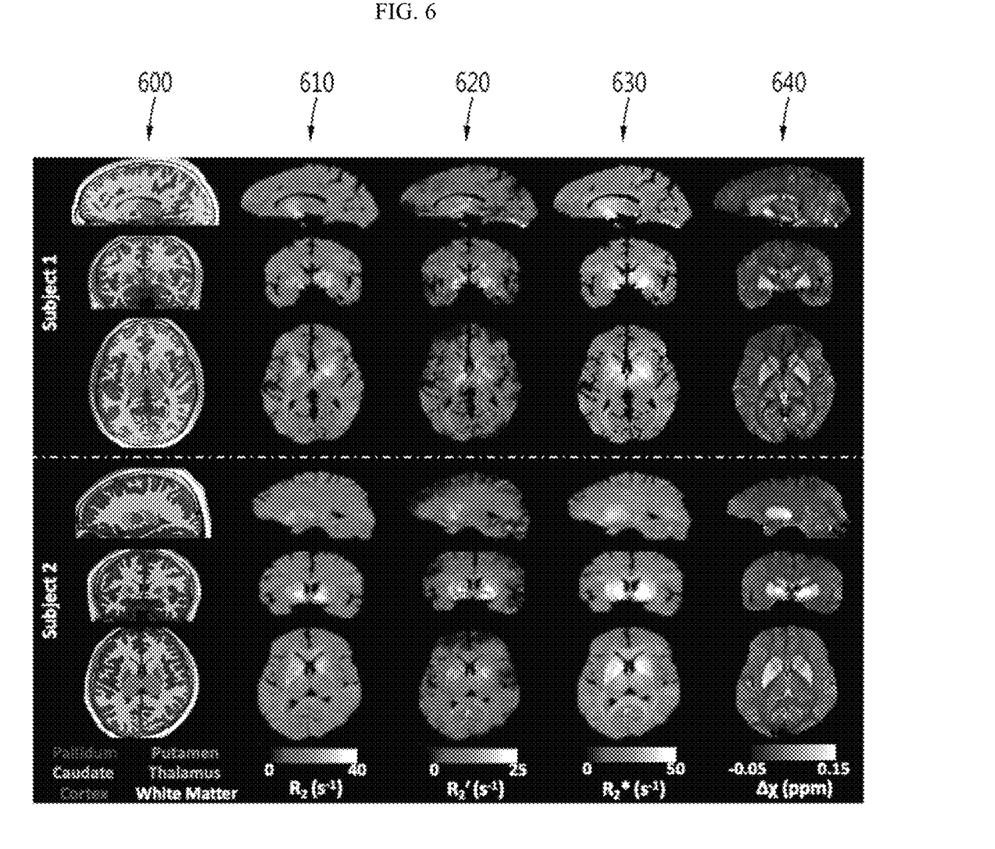
FIG. 6 includes images for explaining the mapping map of a plurality of magnetic resonance imaging parameters measured by a magnetic resonance imaging apparatus according to one embodiment of the present disclosure.

FIG. 6 includes images for explaining the mapping map of a plurality of magnetic resonance imaging parameters measured by a magnetic resonance imaging apparatus according to one embodiment of the present disclosure.

In FIG. 6, regions of interest (ROI) when a plurality of magnetic resonance imaging parameters measured by the magnetic resonance imaging apparatus according to one embodiment of the present disclosure are mapped to the entire brain are displayed on an MPRAGE (magnetization-prepared rapid acquisition with gradient echo) image.

Referring to FIG. 6, the MPRAGE images of a first subject (subject 1) and a second subject (subject 2) are shown. An image 600 may represent a whole brain image for the three orthogonal axes of the first subject (subject 1) and the second subject (subject 2), an image 610 may represent the mapping results of the RF-irreversible transverse relaxation rate constants (R2) of the first subject (subject 1) and the second subject (subject 2), an image 620 may represent the mapping results of the RF-reversible transverse relaxation rate constants (R2') of the first subject (subject 1) and the second subject (subject 2), an image 630 may represent the mapping results of the first relaxation rate constants (R2*) of the first subject (subject 1) and the second subject (subject 2), and an image 640 may represent the mapping results of magnetic susceptibility ($\Delta\chi$) of the first subject (subject 1) and the second subject (subject 2).

Accordingly, the present disclosure may increase a measurement speed for a plurality of magnetic resonance imaging parameters using AUSFIDE image data.

Figure 7A:
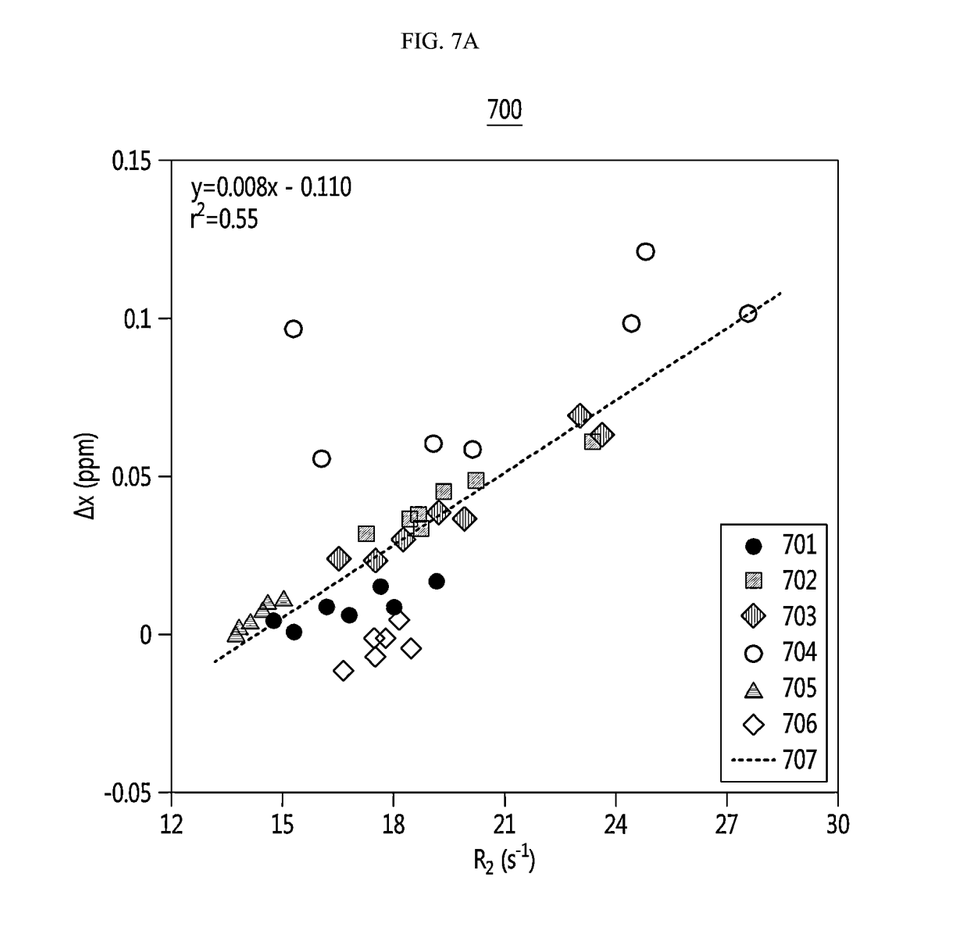
FIGS. 7A to 7C are graphs for explaining correlation between a plurality of magnetic resonance imaging parameters measured by a magnetic resonance imaging apparatus according to one embodiment of the present disclosure.
Figure 7B:
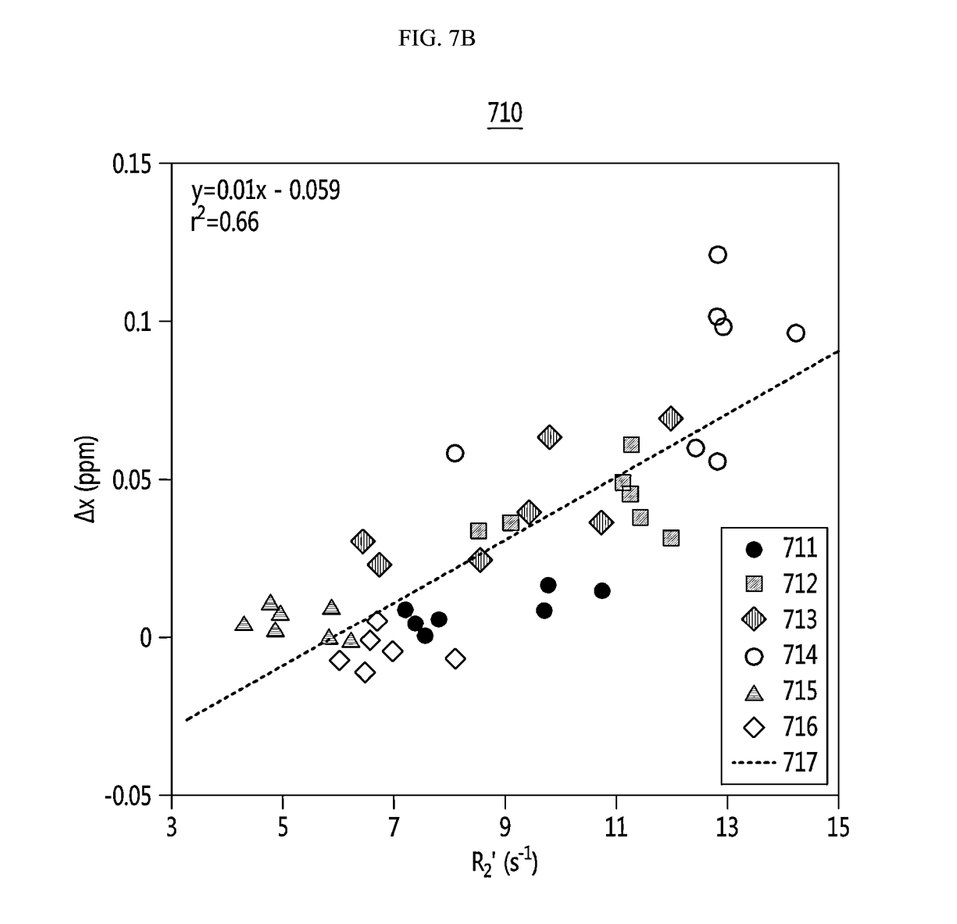
Figure 7C:
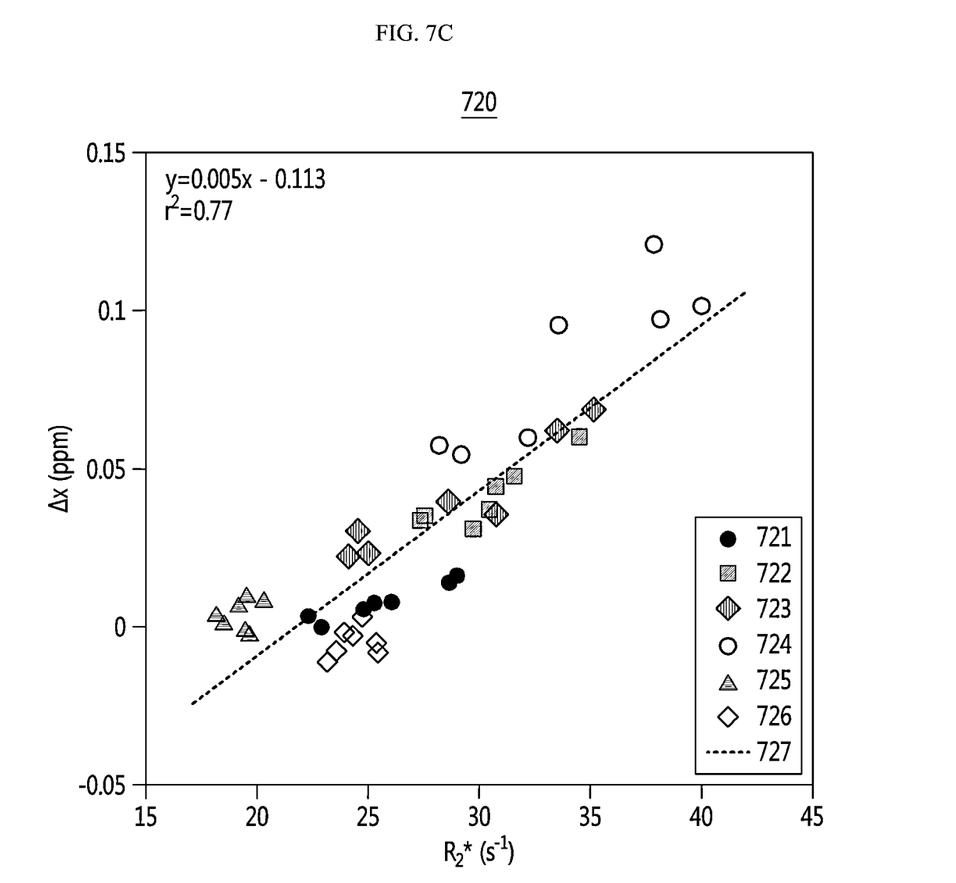

FIGS. 7A to 7C are graphs for explaining correlation between a plurality of magnetic resonance imaging parameters measured by a magnetic resonance imaging apparatus according to one embodiment of the present disclosure.

Referring to FIGS. 7A to 7C, based on correlation between a plurality of magnetic resonance imaging parameters measured by the magnetic resonance imaging apparatus, the thalamus, the caudate, the putamen, the pallidum, the cortex, the white matter, and the regression line may be confirmed.

FIG. 7A may represent correlation between an RF-irreversible transverse relaxation rate constant (R2) and magnetic susceptibility ($\Delta\chi$) among a plurality of magnetic resonance imaging parameters measured by the magnetic resonance imaging apparatus according to one embodiment of the present disclosure.

Referring to a graph 700 of FIG. 7A, the horizontal axis may represent an RF irreversible transverse relaxation rate constant (R2), and the vertical axis may represent magnetic susceptibility ($\Delta\chi$).

The graph 700 may represent a thalamus 701, a caudate 702, a putamen 703, a pallidum 704, a cortex 705, a white matter 706, and a regression line 707 based on correlation between an RF-irreversible transverse relaxation rate constant (R2) and magnetic susceptibility ($\Delta\chi$) among a plurality of magnetic resonance imaging parameters.

FIG. 7B may represent correlation between an RF-reversible transverse relaxation rate constant (R2') and magnetic susceptibility ($\Delta\chi$) among a plurality of magnetic resonance imaging parameters measured by the magnetic resonance imaging apparatus according to one embodiment of the present disclosure.

Referring to a graph 710 of FIG. 7B, the horizontal axis may represent an RF-reversible transverse relaxation rate constant (R2'), and the vertical axis may represent magnetic susceptibility ($\Delta\chi$).

A graph 710 may represent a thalamus 711, a caudate 712, a putamen 713, a pallidum 714, a cortex 715, a white matter 716, and a regression line 717 based on correlation between an RF-reversible transverse relaxation rate constant (R2') and magnetic susceptibility ($\Delta\chi$) among a plurality of magnetic resonance imaging parameters.

FIG. 7C may represent correlation between a first relaxation rate constant (R2*) and magnetic susceptibility ($\Delta\chi$) among a plurality of magnetic resonance imaging parameters measured by the magnetic resonance imaging apparatus according to one embodiment of the present disclosure.

Referring to a graph 710 of FIG. 7C, the horizontal axis may represent a first relaxation rate constant (R2*), and the vertical axis may represent magnetic susceptibility ($\Delta\chi$).

A graph 720 may represent a thalamus 721, a caudate 722, a putamen 723, a pallidum 724, a cortex 725, a white matter 726, and a regression line 727 based on correlation between a first relaxation rate constant (R2*) and magnetic susceptibility ($\Delta\chi$) among a plurality of magnetic resonance imaging parameters.

The parameter estimates of the caudate, the putamen, and the pallidum, which correspond to deep brain structures, are overall high and may be distributed over a wide range throughout the subject.

According to the present disclosure, AUSFIDE (alternating unbalanced SSFP-FID & SSFP-ECHO) image data can be collected by alternately collecting an SSFP-FID signal and an SSFP-ECHO signal and combining the SSFP-FID signal at the front end and the SSFP-ECHO signal at the rear end, and a plurality of magnetic resonance imaging parameters can be measured using the collected AUSFIDE image data.

According to the present disclosure, magnetic resonance imaging for simultaneously measuring a plurality of magnetic resonance imaging parameters including an RF-irreversible transverse relaxation rate constant (R2), an RF-reversible transverse relaxation rate constant (R2'), and susceptibility can be generated.

According to the present disclosure, an SSFP integration sequence can be acquired by alternately collecting an SSFP-FID signal and an SSFP-ECHO signal and combining the SSFP-FID signal at the front end and the SSFP-ECHO signal at the rear end.

According to the present disclosure, a measurement speed for a plurality of magnetic resonance imaging parameters can be increased by using AUSFIDE image data.

According to the present disclosure, a plurality of magnetic resonance imaging parameters including an RF-irreversible transverse relaxation rate constant (R2), an RF-reversible transverse relaxation rate constant (R2'), and susceptibility, which can be used as biomarkers indicating the difference between a normal tissue and a diseased tissue for a specific disease, can be measured.

According to the present disclosure, by inserting image data for z-shimming in the even-numbered data when reconstructing AUSFIDE image data and removing the effect of non-uniformity of a magnetic field in delta omega 0 in the odd-numbered data using the inserted image data, measurement accuracy for magnetic resonance imaging parameters can be improved.

The apparatus described above may be implemented as a hardware component, a software component, and/or a combination of hardware components and software components. For example, the apparatus and components described in the embodiments may be achieved using one or more general purpose or special purpose computers, such as, for example, a processor, a controller, an arithmetic logic unit (ALU), a digital signal processor, a microcomputer, a field programmable gate array (FPGA), a programmable logic unit (PLU), a microprocessor, or any other device capable of executing and responding to instructions. The processing device may execute an operating system (OS) and one or more software applications executing on the operating system.

In addition, the processing device may access, store, manipulate, process, and generate data in response to execution of the software. For ease of understanding, the processing apparatus may be described as being used singly, but those skilled in the art will recognize that the processing apparatus may include a plurality of processing elements and/or a plurality of types of processing elements. For example, the processing apparatus may include a plurality of processors or one processor and one controller. Other processing configurations, such as a parallel processor, are also possible.

The software may include computer programs, code, instructions, or a combination of one or more of the foregoing, configure the processing apparatus to operate as desired, or command the processing apparatus, either independently or collectively. In order to be interpreted by a processing device or to provide instructions or data to a processing device, the software and/or data may be embodied permanently or temporarily in any type of a machine, a component, a physical device, a virtual device, a computer storage medium or device, or a transmission signal wave. The software may be distributed over a networked computer system and stored or executed in a distributed manner. The software and data may be stored in one or more computer-readable recording media.

Although the present disclosure has been described with reference to limited embodiments and drawings, it should be understood by those skilled in the art that various changes and modifications may be made therein. For example, the described techniques may be performed in a different order than the described methods, and/or components of the described systems, structures, devices, circuits, etc., may be combined in a manner that is different from the described method, or appropriate results may be achieved even if replaced by other components or equivalents.

Therefore, other embodiments, other examples, and equivalents to the claims are within the scope of the following claims.

What is claimed is:

1. A magnetic resonance imaging apparatus for measuring a plurality of magnetic resonance imaging parameters, comprising:
   a data collector for alternately collecting a steady-state-free-precession (SSFP)-FID signal and an SSFP-ECHO signal within a time of repetition to obtain AUSFIDE (alternating unbalanced SSFP-FID & SSFP-ECHO) image data;
   a data processor for reconstructing a magnitude image and a phase image for each of the SSFP-FID signal and the SSFP-ECHO signal in the AUSFIDE (alternating unbalanced SSFP-FID & SSFP-ECHO) image data and processing the AUSFIDE (alternating unbalanced SSFP-FID & SSFP-ECHO) image data using the reconstructed magnitude image and phase image; and
   a parameter measuring device for measuring a plurality of magnetic resonance imaging parameters using a plurality of echo data based on the processed AUSFIDE (alternating unbalanced SSFP-FID & SSFP-ECHO) image data.

2. The magnetic resonance imaging apparatus according to claim 1, wherein the data collector generates a plurality of gradient echo signals for each of the steady-state-free-precession (SSFP)-FID signal and the SSFP-ECHO signal within the time of repetition and obtains the AUSFIDE (alternating unbalanced SSFP-FID & SSFP-ECHO) image data.

3. The magnetic resonance imaging apparatus according to claim 1, wherein the data collector determines a first relaxation rate constant (R*) associated with the steady-state-free-precession (SSFP)-FID signal as a sum of an RF-irreversible transverse relaxation rate constant (R2) and an RF-reversible transverse relaxation rate constant (R2').

4. The magnetic resonance imaging apparatus according to claim 1, wherein the data collector determines a second relaxation rate constant (R**) associated with the SSFP-ECHO signal as a difference between an RF-irreversible transverse relaxation rate constant (R2) and an RF-reversible transverse relaxation rate constant (R2').

5. The magnetic resonance imaging apparatus according to claim 1, wherein the magnetic resonance imaging parameters comprise at least one of an RF-irreversible transverse relaxation rate constant (R2), an RF-reversible transverse relaxation rate constant (R2'), and magnetic susceptibility.

6. The magnetic resonance imaging apparatus according to claim 1, wherein the data processor reconstructs a magnitude image and a phase image for each of the SSFP-FID signal and the SSFP-ECHO signal, obtains an induced magnetic field gradient map in a Z-direction using the reconstructed phase image, and estimates a voxel spreading function along the Z-direction using the induced magnetic field gradient map in the Z-direction.

7. The magnetic resonance imaging apparatus according to claim 1, wherein the data processor inserts even-numbered echo data among echo data associated with the reconstructed magnitude images and phase images as correction data for non-uniformity of a magnetic field.

8. The magnetic resonance imaging apparatus according to claim 7, wherein the data processor corrects non-uniformity of the magnetic field by correcting odd-numbered echo data among echo data associated with the reconstructed magnitude images and phase images using the even-numbered echo data.

9. A method of operating a magnetic resonance imaging apparatus for measuring a plurality of magnetic resonance imaging parameters, comprising:
   in a data collector, obtaining AUSFIDE (alternating unbalanced SSFP-FID & SSFP-ECHO) image data by alternately collecting a steady-state-free-precession (SSFP)-FID signal and an SSFP-ECHO signal within a time of repetition;
   in a data processor, reconstructing a magnitude image and a phase image for each of the SSFP-FID signal and the SSFP-ECHO signal in the AUSFIDE (alternating unbalanced SSFP-FID & SSFP-ECHO) image data and processing the AUSFIDE (alternating unbalanced SSFP-FID & SSFP-ECHO) image data using the reconstructed magnitude image and phase image; and
   in a parameter measuring device, measuring a plurality of magnetic resonance imaging parameters using a plurality of echo data based on the processed AUSFIDE (alternating unbalanced SSFP-FID & SSFP-ECHO) image data.

10. The method according to claim 9, wherein the obtaining comprises generating a plurality of gradient echo signals for each of the steady-state-free-precession (SSFP)-FID signal and the SSFP-ECHO signal within the time of repetition and obtaining the AUSFIDE (alternating unbalanced SSFP-FID & SSFP-ECHO) image data.

11. The method according to claim 9, wherein the obtaining comprises determining a first relaxation rate constant (R*) associated with the steady-state-free-precession (SSFP)-FID signal as a sum of an RF-irreversible transverse relaxation rate constant (R2) and an RF-reversible transverse relaxation rate constant (R2'); and
   determining a second relaxation rate constant (R**) associated with the SSFP-ECHO signal as a difference between an RF-irreversible transverse relaxation rate constant (R2) and an RF-reversible transverse relaxation rate constant (R2').

12. The method according to claim 9, wherein the magnetic resonance imaging parameters comprise at least one of an RF-irreversible transverse relaxation rate constant (R2), an RF-reversible transverse relaxation rate constant (R2'), and magnetic susceptibility.

* * * * *